United States Patent [19]
Ueda et al.

[11] Patent Number: 5,892,382
[45] Date of Patent: Apr. 6, 1999

[54] CURRENT MODE LOGIC CIRCUIT, SOURCE FOLLOWER CIRCUIT AND FLIP FLOP CIRCUIT

[75] Inventors: Kimio Ueda; Yuuichi Hirano; Yoshiki Wada, all of Tokyo, Japan

[73] Assignee: Mitsubishi Denki Kabushiki Kaisha, Tokyo, Japan

[21] Appl. No.: 904,940

[22] Filed: Aug. 1, 1997

[30] Foreign Application Priority Data

Mar. 25, 1997 [JP] Japan .................................... 9-072485

[51] Int. Cl.$^6$ .......................... H03K 3/289; H03K 3/356
[52] U.S. Cl. .......................... 327/202; 327/199; 327/208
[58] Field of Search .................................. 327/199, 202, 327/203, 208, 108, 65–67, 77, 112, 427, 334

[56] References Cited

U.S. PATENT DOCUMENTS

| | | | |
|---|---|---|---|
| 4,777,388 | 10/1988 | Widener .................................. | 327/202 |
| 4,779,009 | 10/1988 | Tsunoi et al. ........................... | 327/202 |
| 5,001,361 | 3/1991 | Tamamura et al. ...................... | 327/202 |
| 5,017,814 | 5/1991 | Lloyd ..................................... | 327/202 |
| 5,220,212 | 6/1993 | Sinh ....................................... | 324/202 |
| 5,552,723 | 9/1996 | Shigehara et al. ....................... | 326/86 |

FOREIGN PATENT DOCUMENTS

A-7/86917  3/1995  Japan .......................... H03K 17/687

OTHER PUBLICATIONS

"Analogue and Digital Hybrid LSI to Prevent Digital Noise Transfer," *Nikkei Electronics*, Dec. 26 1988, pp. 199–202, (Statement of relevance attached.).

Primary Examiner—Toan Tran
Attorney, Agent, or Firm—Burns, Doane, Swecker & Mathis, LLP

[57] ABSTRACT

A current mode logic circuit has a first and second NMOS transistors N1 and N2, an input terminal IN connected to both gates of the first and second NMOS transistors N1 and N2 to input data, a reference voltage input terminal REF, an output terminal OUT connected to a drain of the first NMOS transistor N1, and a current power source I connected both sources of the first and second NMOS transistors N1 and N2. Body terminals of the first and second NMOS transistors N1and N2 are connected to the input terminal IN and the reference terminal REF, respectively so that the body voltage of each of the first and second NMOS transistors N1 and N2 is controlled.

4 Claims, 10 Drawing Sheets

CURRENT MODE LOGIC CIRCUIT, SOURCE FOLLOWER CIRCUIT AND FLIP FLOP CIRCUIT

BACKGROUND OF THE INVENTION

1. Field of the Invention

The present invention relates to a current mode logic circuit, a source follower circuit, and a flip flop circuit which use MOS transistors that are capable of operating at a high speed in a low voltage by controlling the voltage of a body region in each MOS transistor.

2. Description of the Related Art

Conventional Example 1.

FIG. 1 is a circuit diagram showing a conventional current mode logic circuit using MOS transistors. In FIG. 1, the reference characters N1 and N2 designate N conductivity type Metal Oxide Semiconductor (hereinafter referred to as NMOS) transistors, "R1" and "R2" denote resistors, "I" indicates a constant current source, "IN" designates an input terminal connected to the gate of the NMOS transistor N1, "OUT" denotes an output terminal connected to the drain of the NMOS transistor, "REF" indicates an input terminal through which a reference voltage is supplied, "d" designates a node, "B" designates a body terminal of both the NMOS transistors N1 and N2.

Next, a description will be given of the operation of the conventional current mode logic circuit shown in FIG. 1.

Each of the voltage value, the current value, and the resistor value used in the following explanation is an example. For example, the magnitude of the power source voltage is 2.0 V, the magnitude of the reference voltage or reference voltage potential is 1.2 V, the resistor value of each of the resistors R1 and R2 is 1 KΩ, the current value provided from the current source I is 0.4 mA, the threshold voltage of each of the NMOS transistors N1 and N2 is 0.4 V. The square wave voltages of 1.0 V and 1.4 V are supplied as a voltage of a low level and a voltage of a high level to the input terminal IN, respectively.

Firstly, it will be explained to determine a method of the voltage of the node d according to the input voltage supplied to the input terminal IN. The voltage of the node d becomes a voltage obtained by subtracting the voltage at the input terminal IN or the reference voltage REF from the threshold voltage of the NMOS transistors N1 and N2. When the voltage of the low level is supplied to the input terminal IN, the voltage at the node d becomes 0.8 V that is obtained by subtracting the supplied voltage from the threshold voltage of the NMOS transistor. When the voltage of the high level is supplied to the input terminal IN, the voltage at the node d becomes 1.0 V that is also obtained by subtracting the supplied voltage from the threshold voltage of the NMOS transistor.

Next, the ON-OFF operation of the NMOS transistors N1 and N2 and the change of the voltage at the output terminal OUT will be explained.

When the voltage 1.0 V of the low level is supplied to the input terminal IN, the voltage difference between the gate and the source of the NMOS transistor N1 becomes 0.2 V. Because this voltage difference is lower than the threshold voltage 0.4 V of the NMOS transistor N1, the NMOS transistor becomes OFF. On the other hand, because the voltage difference between the gate and the source of the NMOS transistor N2 becomes 0.4 V, the NMOS transistor is OFF. Accordingly, the voltage at the output terminal OUT becomes 2.0 V that is the voltage value of the constant current source.

Next, when the voltage of 1.4 V as the high level is supplied to the input terminal IN, the NMOS transistor N1 becomes ON and the NMOS transistor N2 becomes OFF, because the voltage difference between the gate and the source of the NMOS transistor N1 becomes 0.4 V and the voltage difference between the gate and the source of the NMOS transistor N2 becomes 0.2 V. In this case, because the current of 0.4 mA flows through the resistor R1, the voltage of the output terminal OUT becomes 1.6 V.

The following results were obtained.

| Voltage (V) at input terminal IN | Voltage (V) at output terminal OUT |
| --- | --- |
| 1.0 | 2.0 |
| 1.4 | 1.6 |

According to the relationship of the voltages at the input/output terminals, as described above, it can be understood that the conventional current mode logic circuit shown in FIG. 1 has the function of an inverter that is capable of inverting an input voltage supplied to the input terminal IN.

Conventional Example 2.

FIG. 2 is a circuit diagram showing a flip flop circuit having a source follower circuit. In FIG. 2, the reference characters R1 to R4 designate resistors, Q1 to Q16 denotes NMOS transistors, CS1 to CS6 indicate constant current sources, C designates a clock input terminal through which a clock signal is inputted, D designates a data signal input terminal, VB1 denotes a first reference voltage terminal through which an input data item is inputted, and VB2 indicates a second reference voltage terminal to which a reference voltage is supplied.

The conventional flip flop circuit shown in FIG. 2 comprises a master circuit having the NMOS transistors Q1 to Q8, the resistors R1 and R2, and the constant current sources CS1 to CS3, and a slave circuit having the NMOS transistors Q9 to Q16, the resistors R3 and R4, the constant current sources CS4 to CS6. The configuration of the master circuit has the same as that of the slave circuit.

Next, a description will be given of the operation of the conventional flip flop shown in FIG. 2.

In the following explanation, the threshold voltage having the logical amplitude of a signal to be inputted to the data input terminal D is provided to the first reference voltage terminal VB1. The threshold voltage having the logical amplitude of a signal to be inputted to the clock input terminal C is provided to the second reference voltage terminal VB2. The pair of the NMOS transistors Q1 and Q2 and a pair of the NMOS transistors Q9 and Q10 form data write circuits, respectively. The pair of the NMOS transistors Q4 and Q5 and a pair of the NMOS transistors Q12 and Q13 form data store circuits, respectively.

When the value of the clock signal supplied to the clock signal input terminal C is a high level (for example, the logical value "1"), the NMOS transistors Q3 and Q14 become ON and the data write circuit in the master circuit and the data store circuit in the slave circuit become ON. The NMOS transistors Q6 and Q11 become OFF and the data store circuit in the master circuit and the data write circuit in the slave circuit become OFF. In this situation, when the value of the data signal ID1 supplied to the NMOS transistor Q1 is the high level, the NMOS transistor Q1 becomes ON and the NMOS transistor Q2 becomes OFF and the current determined by the magnitude of the constant current source CS1 flows in the resistor R1 through the NMOS transistors Q1 and Q3. Accordingly, the NMOS transistor Q8 outputs the output of the low level. On the other hand, because the NMOS transistor Q2 is OFF, no current flows in the resistor R2 and the NMOS transistor Q7 outputs the signal of the high level. Thereby, the data writing operation is performed in the master circuit. In the slave circuit, because the data store circuit enters the ON state, the data signal ID0 that is previously stored is kept and output to the data signal output terminals through the NMOS transistors Q15 and Q16. Like the operation of the NMOS transistors Q7 and Q8, the NMOS transistors Q15 and Q16 output signals that are complementary data items to each other in level, respectively. In this situation, when the voltage level of the clock signal supplied to the clock signal input terminal C is changed from the high level to the low level, the NMOS transistors Q6 and Q11 become ON and both the data store circuit in the master circuit and the data write circuit in the slave circuit become ON. The NMOS transistors Q3 and Q14 become OFF. The data write circuit in the master circuit and the data store circuit in the slave circuit become OFF.

The gate terminals of the NMOS transistors Q4 and Q5 are connected to the source terminal of the NMOS transistors Q7 and Q8, respectively. The NMOS transistor Q4 becomes ON and the NMOS transistor Q5 becomes OFF according to the data signal ID1 that has been inputted when the level of the clock signal is the high level. Thereby, the NMOS transistors Q7 and Q8 are continuously outputting the same value, that is obtained in the high level of the clock signal, to the slave circuit. Since the data write circuit in the slave circuit is in the ON state, the NMOS transistor Q7 outputs the signal of the high level and the NMOS transistor Q8 outputs the signal of the low level. Thereby, the NMOS transistor Q9 becomes ON and the NMOS transistor Q10 becomes OFF. Accordingly, the current, whose magnitude has been set by the constant current source CS4, flows in the resistor R3 through the NMOS transistors Q9 and Q11. Thereby, the NMOS transistor Q16 outputs the signal of the low level. Because the NMOS transistor Q10 is in the OFF state, no current flows in the resistor R4 and the NMOS transistor Q15 outputs the signal of the high level. Thus, the data is updated in the slave circuit.

The conventional flip flop circuit shown in FIG. 2 operates in the same manner described above when the level of the input data item inputted to the data input terminal is the low level. In this case, the NMOS transistor Q16 outputs the signal of the high level and the NMOS transistor Q15 outputs the signal of the low level.

As described above in detail, in the conventional flip flop circuit shown in FIG. 2, the master circuit inputs data when the level of the clock signal is the high level and the slave circuit updates its stored data when the level of the clock signal is the low level.

FIG. 3 is a timing chart showing the operation of the conventional flip flop circuit shown in FIG. 2. As shown in the timing chart of FIG. 3, the conventional flip flop circuit shown in FIG. 2 inputs the input data signal (D), ID0, ID2, ID3, . . . through the input terminal D according to the clock signal provided to the clock signal input terminal C, and then outputs the output data signal (Q) ID0, ID1, ID2, ID3, . . . , and the output data signal (QB) /ID0, /ID1, /ID2, /ID3, . . . through the output data terminals Q and QB, respectively, after several clocks have been elapsed.

FIG. 4 is a circuit diagram showing the constant current source incorporated in the conventional flip flop shown in FIG. 2. In FIG. 4, the reference character Id designates a current, Vcs denotes a voltage supplied to the gate of a MOS transistor, and Vd indicates a voltage supplied to the drain of the MOS transistor.

FIG. 5 is a diagram showing the current-voltage characteristic of the constant current source shown in FIG. 4. As shown in FIG. 5, in general, a voltage in the saturated region is used as the drain voltage to be supplied to the drain of the MOS transistor in order to flow the current Id of a constant value even if the drain voltage Id is changed. In addition, the voltage Vcs2 shown in FIG. 5 has a higher voltage level than that of the voltage Cs1. In order to obtain a desired current value Id, the voltage Vcs is set to the voltage Vcs2 or Vcs1.

In the conventional current mode logic circuit as the conventional example 1 shown in FIG. 1, because the voltage difference Vsb between the source and the body terminal is increased when the body terminal B of the NMOS transistors N1 and N2 is connected to the ground source voltage GND, the threshold voltage of the NMOS transistor is increased based on a substrate bias effect. As has been described in the conventional example 1, the conventional current mode logic circuit using the NMOS transistors N1 and N2 requires to input the input signal wave whose amplitude is approximately equal to that of the threshold voltage of the NMOS transistor. Therefore there is a drawback that it is difficult to decrease the voltage of the power source.

Furthermore, in the conventional current mode logic circuit as the conventional example 1 shown in FIG. 1, the resistors R1 and R2 are formed so that the values of them can be changed. In this case, it is possible to perform the current mode logic circuit at a high speed when the value of the resistor R1 is increased under the NMOS transistor N1 is ON and when the value of the resistor R1 is decreased under the NMOS transistor N1 is OFF.

Moreover, the conventional flip flop circuit having the configuration as the conventional example 2 shown in FIG. 2 uses the constant current power circuit having the characteristic shown in FIG. 3. Accordingly, in the source follower circuit comprising the NMOS transistor Q7 and the constant current source CS2, the NMOS transistor Q8 and the constant current source CS3, the NMOS transistor Q15 and the constant current source CS5, and the NMOS transistor Q16 and the constant current source CS6, although it is possible to perform the operation at a high speed when the level of the output data is changed from the low level to the high level, there is a drawback that the operation speed is decreased or down when the level of the output data is changed from the high level to the low level.

This means that the NMOS transistors Q7, Q8, Q15, and Q16 having a higher driving ability operate when the level of the output is increased, namely, the current that is proportion to square of the gate voltage flows when the load capacity in each of the NMOS transistors Q7, Q8, Q15, and Q16 is large, and on the other hand, when the output of the flip flop circuit is decreased, a current having a constant current value flows from the constant current source CS2, CS3, CS5, and CS6.

SUMMARY OF THE INVENTION

Accordingly, an object of the present invention is, with due consideration to the drawbacks of the conventional current mode logic circuit, to provide a current mode logic circuit that is capable of operating in a low voltage and at a high speed.

In addition, another object of the present invention is to provide a source follower circuit and a flip flop circuit having the source follower circuit that are capable of performing at a high speed by flowing a current of a large magnitude when the edge of output data rises.

In accordance with a preferred embodiment of the present invention, a current mode logic circuit comprises a current mode logic circuit comprises a first NMOS transistor and a second NMOS transistor, a data input terminal connected to a gate of the first NMOS transistor to which data is inputted, a reference voltage input terminal connected to a gate of the second NMOS transistor to which a reference voltage is supplied, an output terminal connected to a drain of the first NMOS transistor, and a constant current source connected to both of sources of the first NMOS transistor and the second NMOS transistor. In the current mode logic circuit, a body terminal of the first NMOS transistor is connected to the data input terminal and a body terminal of the second NMOS transistor is connected to the reference voltage input terminal so that a level of a body voltage of each of the first NMOS transistor and the second NMOS transistor is controlled. Thereby, it is possible to reduce the threshold voltage of each of the first and second NMOS transistors and to perform them in a low voltage.

In the current mode logic circuit as another preferred embodiment according to the present invention, a drain of each of the first NMOS transistor and the second NMOS transistor is connected to a power source voltage. Thereby, the current mode logic circuit can operate in a low voltage.

In accordance with another preferred embodiment of the present invention, a current mode logic circuit comprises a first NMOS transistor and a second NMOS transistor, a data input terminal connected to a gate of the first NMOS transistor to which data is inputted, a reference voltage input terminal connected to a gate of the second NMOS transistor to which a reference voltage is supplied, an output terminal connected to a drain of the first NMOS transistor or the second NMOS transistor, a first PMOS transistor as a load element whose source is connected to a power source voltage and whose gate is connected to a ground source and whose drain is connected to a drain of the first NMOS transistor, and a second PMOS transistor as a load element whose source is connected to the power source voltage and whose gate is connected to the ground source and whose drain is connected to a drain of the second NMOS transistor. In the current mode logic circuit, a body terminal of the first PMOS transistor is connected to the drain of the second NMOS transistor and a body terminal of the second PMOS transistor is connected to the drain of the first NMOS transistor, wherein an ON resistance of each of the first PMOS transistor and the second PMOS transistor is controlled by adjusting a level of the body voltage of the first PMOS transistor and the second PMOS transistor. Thereby, the current mode logic circuit can operate at a high speed.

In the current mode logic circuit as another preferred embodiment according to the present invention, the gate of each of the first PMOS transistor and the second PMOS transistor is connected to the ground source, the body terminal of the first PMOS transistor is connected to the gate of the first NMOS transistor, the body terminal of the second PMOS transistor is connected to the drain of the first NMOS transistor so that the ON resistance of each of the first PMOS transistor and the second PMOS transistor is controlled. Thereby, the current mode logic circuit can operate at a high speed.

In accordance with another preferred embodiment of the present invention, a source follower circuit comprising a current switch comprises a fifth NMOS transistor and a sixth NMOS transistor, a seventh NMOS transistor connected to a source of the fifth NMOS transistor, an eighth NMOS transistor connected to a source of the sixth NMOS transistor, and a current power source connected to both of the sources of the seventh NMOS transistor and the eighth NMOS transistor. In the source follower circuit, both gates of the fifth NMOS transistor and the eighth NMOS transistor form a first input terminal to which a first input is provided, both gates of the sixth NMOS transistor and the seventh NMOS transistor form a second input terminal to which a second input whose level is obtained by inverting the level of the first input is provided, the source of the fifth NMOS transistor is connected to a drain of the seventh NMOS transistor, and the source of the sixth NMOS transistor is connected to a drain of the eighth NMOS transistor. Thereby, the source follower circuit can operate at a high speed.

In the source follower circuit as another preferred embodiment according to the present invention, resistors are connected between the source of the seventh NMOS transistor and the current power source, and between the source of the eighth NMOS transistor and the current power source, respectively. Thereby, the current mode logic circuit can operate at a high speed.

In accordance with another preferred embodiment of the present invention, a flip flop circuit comprises the source follower circuit as described above, a data write circuit comprising at least two NMOS transistors, and a data store circuit for storing data comprising at least two NMOS transistor. In the flip flop circuit, a pair of a drain of one of the two NMOS transistors in the data write circuit and a drain of one of the two NMOS transistors in the data store circuit is connected to the gate of the fifth NMOS transistor, and a pair of a drain of the other NMOS transistor in the data write circuit and a drain of the other NMOS transistors in the data store circuit is connected to the gate of the sixth NMOS transistor in the source follower circuit, respectively, and gates of the two NMOS transistors in the data store circuit are connected to the sources of the fifth NMOS transistor and the sixth NMOS transistor, respectively. Thereby, the flip flop circuit can operate at a high speed.

In accordance with another preferred embodiment of the present invention, a flip flop circuit comprises the source follower circuit as described above, a data write circuit comprising at least two NMOS transistors, and a data store circuit for storing data comprising at least two NMOS transistors. In the flip flop circuit, a pair of a drain of one of the two NMOS transistors in the data write circuit and a drain of one of the two NMOS transistors in the data store circuit is connected to the gate of the fifth NMOS transistor, and a pair of a drain of the other NMOS transistor in the data write circuit and a drain of the other NMOS transistors in the data store circuit is connected to the gate of the sixth NMOS transistor in the source follower circuit, respectively, and gates of the two NMOS transistors in the data store circuit are connected to the sources of the fifth NMOS transistor and the sixth NMOS transistor, respectively. Thereby, the flip flop circuit can operate at a high speed.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a current mode logic circuit, a source follower circuit, and a flip flop circuit according to the present invention will now be described with reference to the drawings.

First Embodiment

Figure 1:
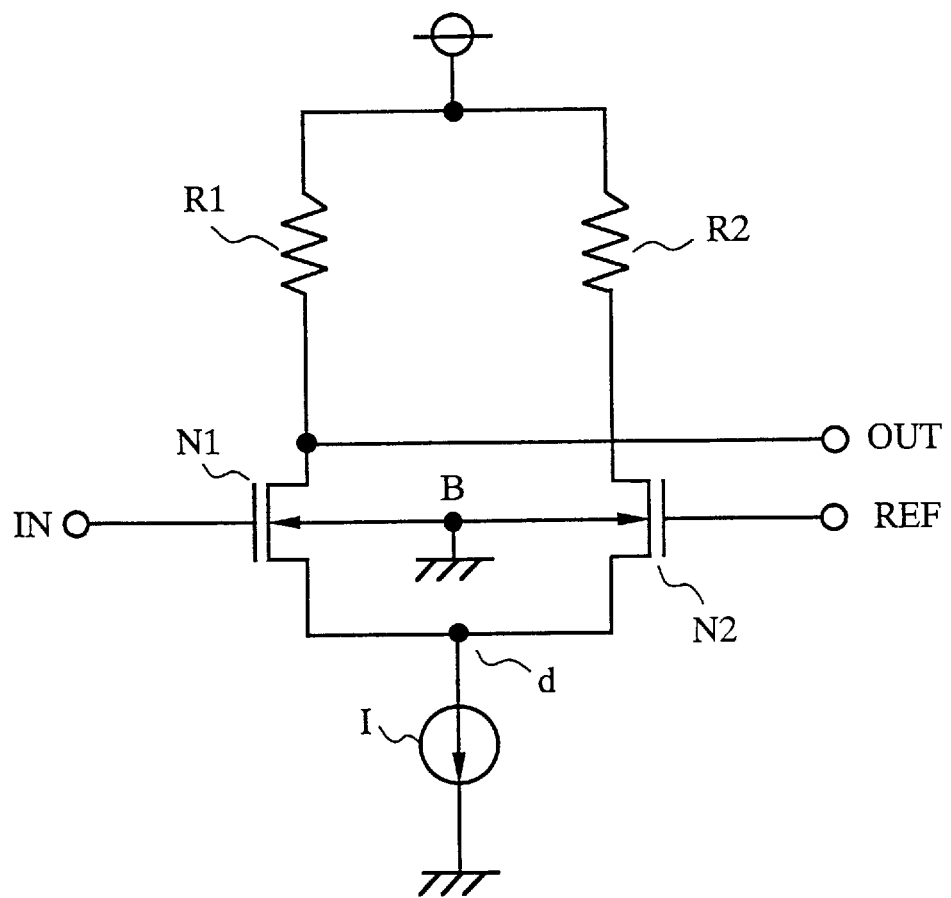
FIG. 1 is a circuit diagram showing a conventional current mode logic circuit using MOS transistors.
Figure 2:
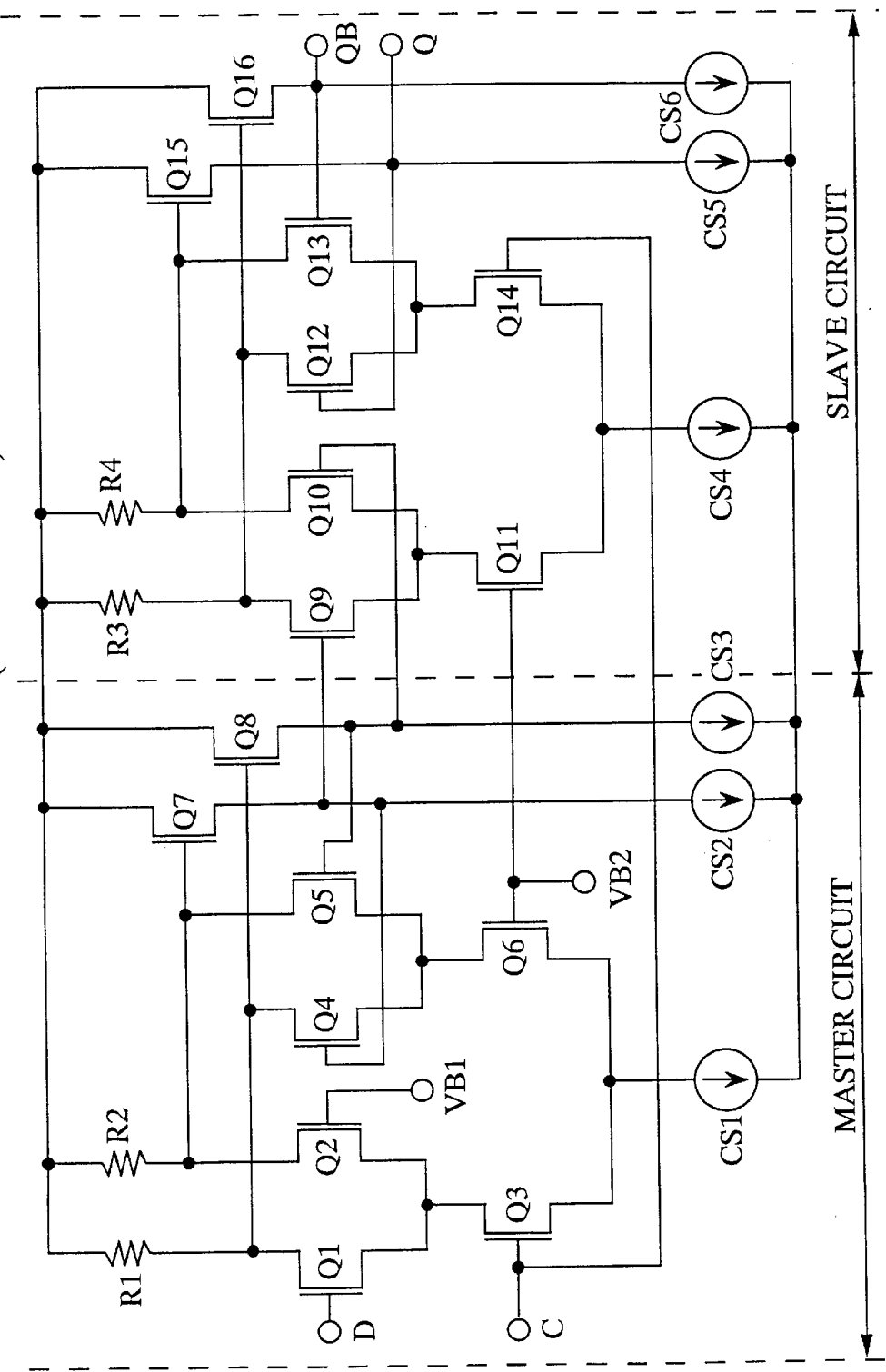
FIG. 2 is a circuit diagram showing a flip flop circuit having a source follower circuit.
Figure 3:
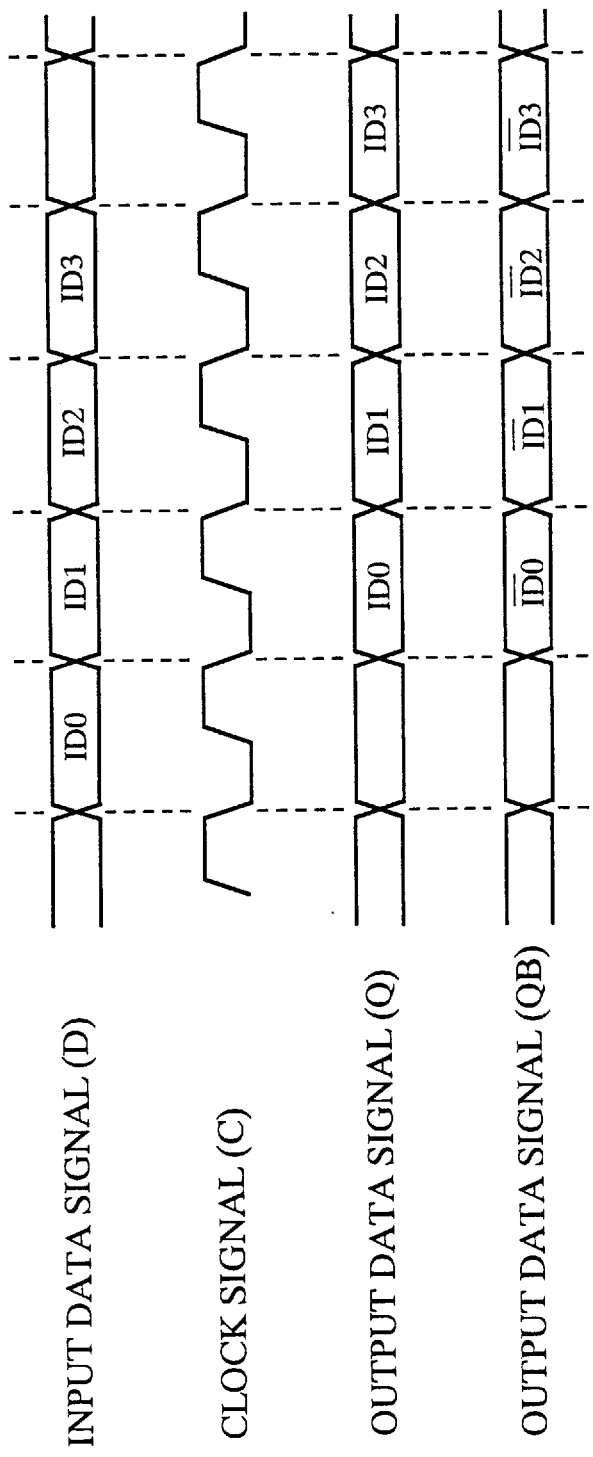
FIG. 3 is a timing chart showing the operation of the conventional flip flop circuit shown in FIG. 2.
Figure 4:
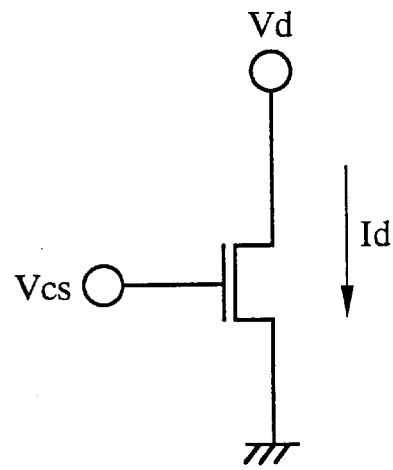
FIG. 4 is a circuit diagram showing the constant current source incorporated in the conventional flip flop circuit shown in FIG. 2.
Figure 5:
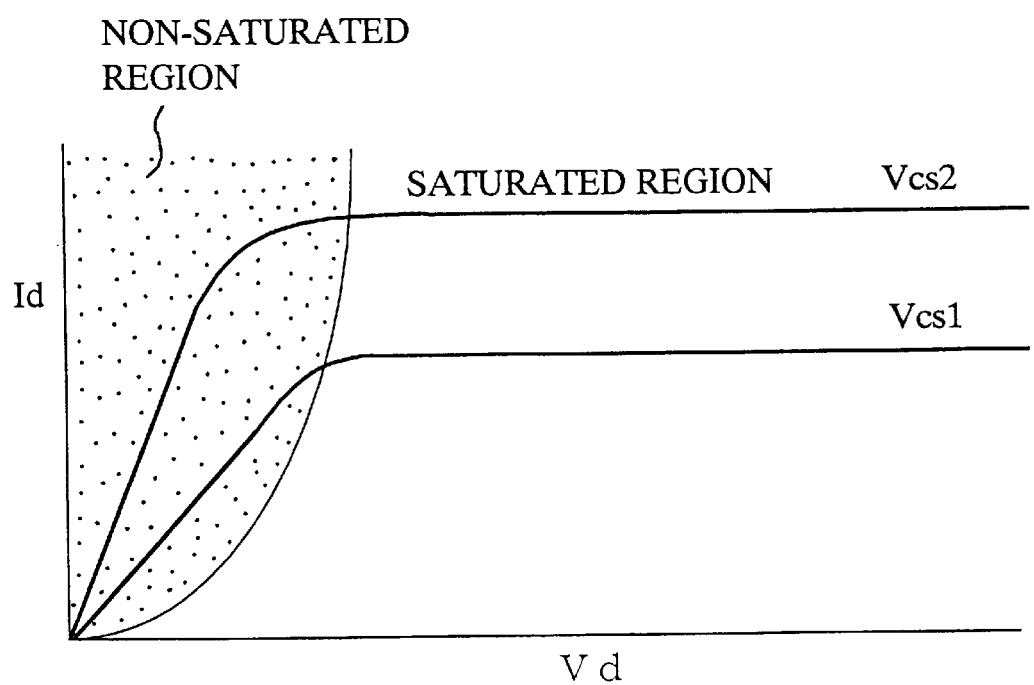
FIG. 5 is a diagram showing the current-voltage characteristic of the constant current source shown in FIG. 4.
Figure 6:
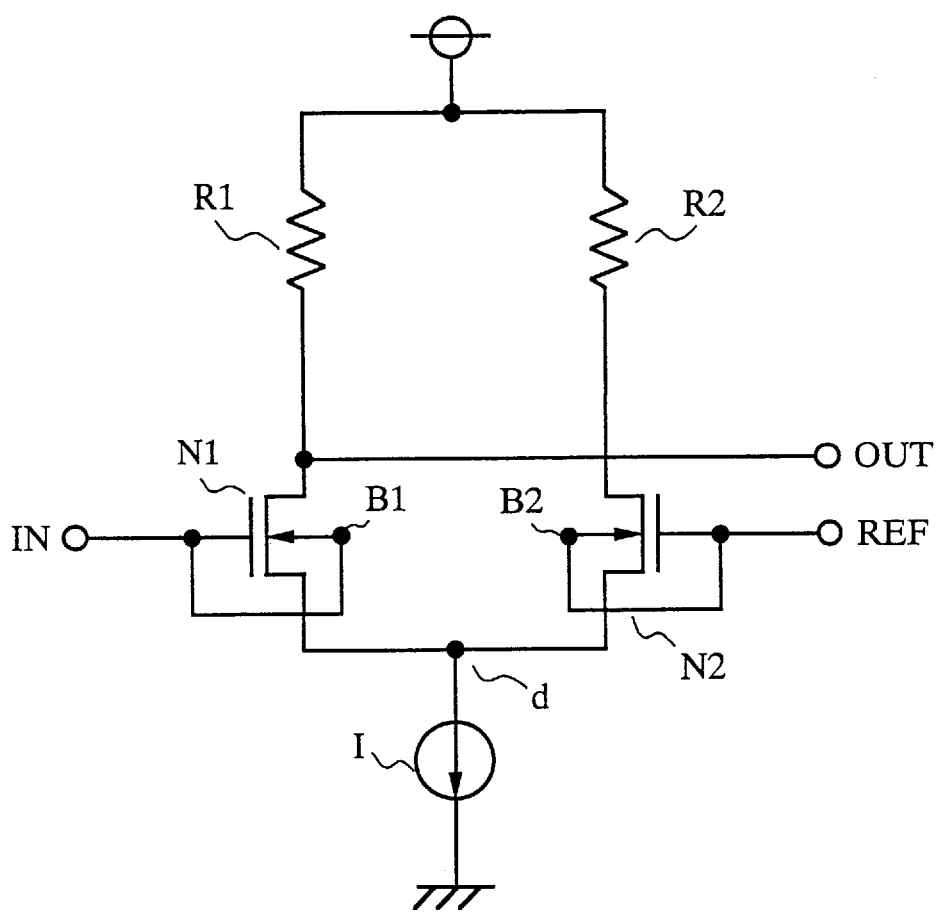
FIG. 6 is a circuit diagram showing a current mode logic circuit as the first embodiment according to the present invention.

FIG. 6 is a circuit diagram showing the current mode logic circuit as the first embodiment according to the present invention. In FIG. 6, the reference characters N1 and N2 designate N conductivity type Metal Oxide Semiconductor (hereinafter referred to as NMOS) transistors (in Claims these NMOS transistors N1 and N2 are referred to as the first and second NMOS transistors, respectively), "R1" and "R2" denote resistors, "I" indicates a constant current source, "IN" designates an input terminal connected to the gate of the NMOS transistor N1, "OUT" denotes an output terminal connected to the drain of the NMOS transistor, "REF" indicates an input terminal through which a reference voltage is supplied, "d" designates a node, and "B1" and "B2" designate body terminals of the NMOS transistors N1 and N2, respectively. As shown in FIG. 6, the current mode logic circuit of the first embodiment has the configuration in which both of the body terminals B1 and B2 of the NMOS transistors N1 and N2 are connected to the gate terminals of them, respectively. Thereby, the current mode logic circuit can decrease the threshold voltage of the NMOS transistor and can operate under a low voltage.

Next, a description will be given of the operation of the current mode logic circuit shown in FIG. 6.

Because each of the body terminals B1 and B2 of the NMOS transistors N1 and N2 is connected to each gates terminal, the voltage difference Vsb between the source terminal and the body terminal becomes a negative value.

In the following explanation, in order to compare the present invention with the conventional example easily and clearly, the voltage of the power source is 2.0 V, the reference voltage is 1.2 V, each of the resistors R1 and R2 is 1 kΩ, the current supplied from the constant current source I is 0.4 mA, and the threshold voltage of each of the NMOS transistors N1 and N2 is 0.4 V. In addition to this condition, the voltage of a rectangle wave of 1.0 V is supplied to the input terminal IN as the voltage of a low level. The voltage of a rectangle wave of 1.4 V is supplied to the input terminal IN as the voltage of a high level.

When the voltage supplied to the input terminal IN is changed from 1.0 V to 1.4 V, the range of the voltage at the node is changed between 0.8 V and 1.0 V. In the current mode logic circuit of the first embodiment, because the body terminal B1 of the NMOS transistor N1 is connected to the input terminal IN, the voltage difference becomes Vsb. In addition to this, the threshold voltage of the NMOS transistor becomes low according to decreasing of the voltage difference Vsb between the source and the body terminal of the NMOS transistor based on the substrate bias effect.

As described above in detail, according to the first embodiment of the present invention, because the threshold voltage of the NMOS transistor becomes low according to decreasing of the voltage difference Vsb between the source terminal and the body terminal of the NMOS transistor based on the substrate bias effect, it is possible to decrease the threshold voltage of the NMOS transistor and the magnitude of the power source voltage in the current mode logic circuit having the configuration shown in FIG. 6

Second Embodiment

Figure 7:
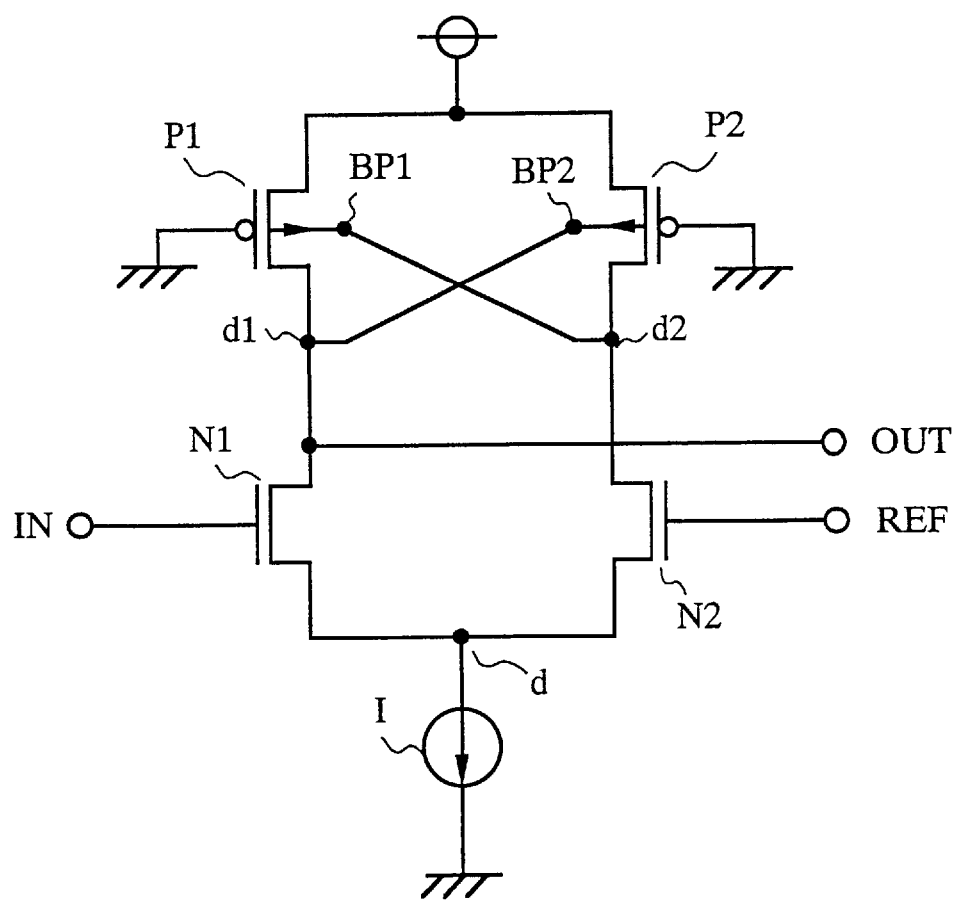
FIG. 7 is a circuit diagram showing a current mode logic circuit as the second embodiment according to the present invention.
Figure 8:
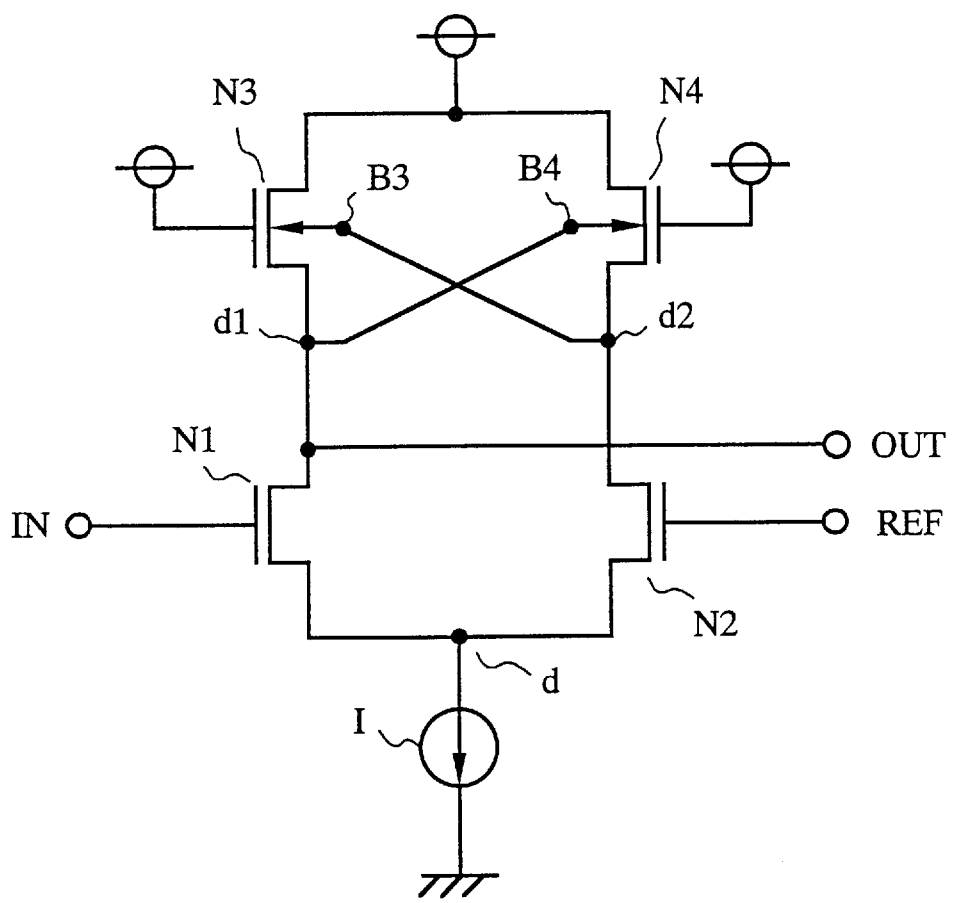
FIG. 8 is a circuit diagram showing another configuration of the current mode logic circuit shown in FIG. 7.

FIG. 7 is a circuit diagram showing a current mode logic circuit as the second embodiment according to the present invention. FIG. 8 is a circuit diagram showing another configuration of the current mode logic circuit of the second embodiment shown in FIG. 7. In FIGS. 7 and 8, the reference characters P1 and P2 designate P conductivity type Metal Oxide Semiconductor (hereinafter referred to as PMOS) transistors (in Claims these PMOS transistors P1 and P2 are referred to as the first and second PMOS transistors, respectively), "BP1" and "BP2" denote body terminals of the PMOS transistors P1 and P2, respectively. "d1" and "d3" designate nodes, and the reference characters N3 and N4 designate N conductivity type Metal Oxide Semiconductor (hereinafter referred to as NMOS) transistors, and "B3" and "B4" denote body terminals of the NMOS transistors N3 and N4, respectively. Other components in the current mode logic circuit of the second embodiment are the same as those in the current mode logic circuit of the first embodiment shown in FIG. 6, therefore, the explanation of them is omitted here.

In the current mode logic circuit as the second embodiment, as shown in FIGS. 7 and 8, the PMOS transistors P1 and P2 (shown in FIG. 7) or the NMOS transistors N3 and N4 (shown in FIG. 8) are incorporated in spite of the resistors R1 and R2 in the first embodiment. In addition, the body terminals of the PMOS transistors P1 and P2 are connected to the drains of the NMOS transistors N2 and N1, respectively, as shown in FIG. 7, and the body terminals of the NMOS transistors N3 and N4 are connected to the drains of the NMOS transistors N2 and N1, respectively, as shown in FIG. 8.

Furthermore, the gates of the PMOS transistors P1 and P2 are connected to the ground source GND in the current mode logic circuit shown in FIG. 7, and the gates of the PMOS transistors N3 and N4 are connected to the power source in the current mode logic circuit shown in FIG. 8.

Because the current mode logic circuit of the second embodiment having the configuration in which the body terminals BP1 and BP2 of the PMOS transistors P1 and P2 and the body terminals B3 and B4 of the NMOS transistor N3 and N4 are connected to the drain terminals, respectively, as described above, the On resistance can be controlled by adjusting the voltage at the body terminal of each of the PMOS transistors P1 and P2 and the NMOS transistors N3 and N4 so that the current mode logic circuit operates at a high speed.

Next, a description will be given of the operation of the current mode logic circuits of the second embodiment shown in FIG. 7 and FIG. 8.

Hereinafter, the operation of the current mode logic circuit shown in FIG. 7 will be mainly explained because the operation of the current mode logic circuit is basically same as that of the current mode logic circuit shown in FIG. 8.

When the voltage of a low level is inputted to the input terminal IN, the NMOS transistor N1 becomes OFF and the NMOS transistor N2 becomes ON. At this time, the voltage potential at the node d is increased and the voltage potential at the node d2 is decreased. Thereby, the voltage potential at the body terminal of the PMOS transistor P1 is decreased and the threshold voltage of the PMOS transistor P1 is decreased based on the substrate bias effect. Therefore, the On resistance of the PMOS transistor P1 is decreased and the voltage potential at the output terminal OUT is increased.

When the voltage of a high level is inputted to the input terminal IN, the NMOS transistor N1 becomes ON and the NMOS transistor N2 becomes OFF. At this time, because the voltage potential at the body terminal of the PMOS transistor P1 is increased and the threshold voltage of the PMOS transistor P1 is increased, the On resistance of the PMOS transistor P1 is increased and the voltage potential at the output terminal OUT can be easily decreased.

Although the explanation of the current mode logic circuit of the second embodiment shown in FIG. 7 has been described based on inverter logic, the present invention is not limited by this. For example, the present invention can be applied to a current mode logic circuit based on buffer logic in which the drain terminal of the NMOS transistor N2 is connected to the output terminal OUT. The operation of the current mode logic circuit based on the buffer logic is the same as that of the current mode logic circuit based on the inverter logic.

As described above in detail, according to the second embodiment of the present invention, the body terminal BP1 and BP2 in the PMOS transistors P1 and P2 and the body terminals B3 and B4 in the NMOS transistors N3 and N4 are connected to the drain terminals, respectively. Thereby, it is possible to perform the current mode logic circuit at a high speed because the threshold voltages of the PMOS transistors P1 and P2 and the NMOS transistor N3 and N4 can be increased so that the voltage potential at the output terminal OUT can be easily decreased.

Third Embodiment

Figure 9:
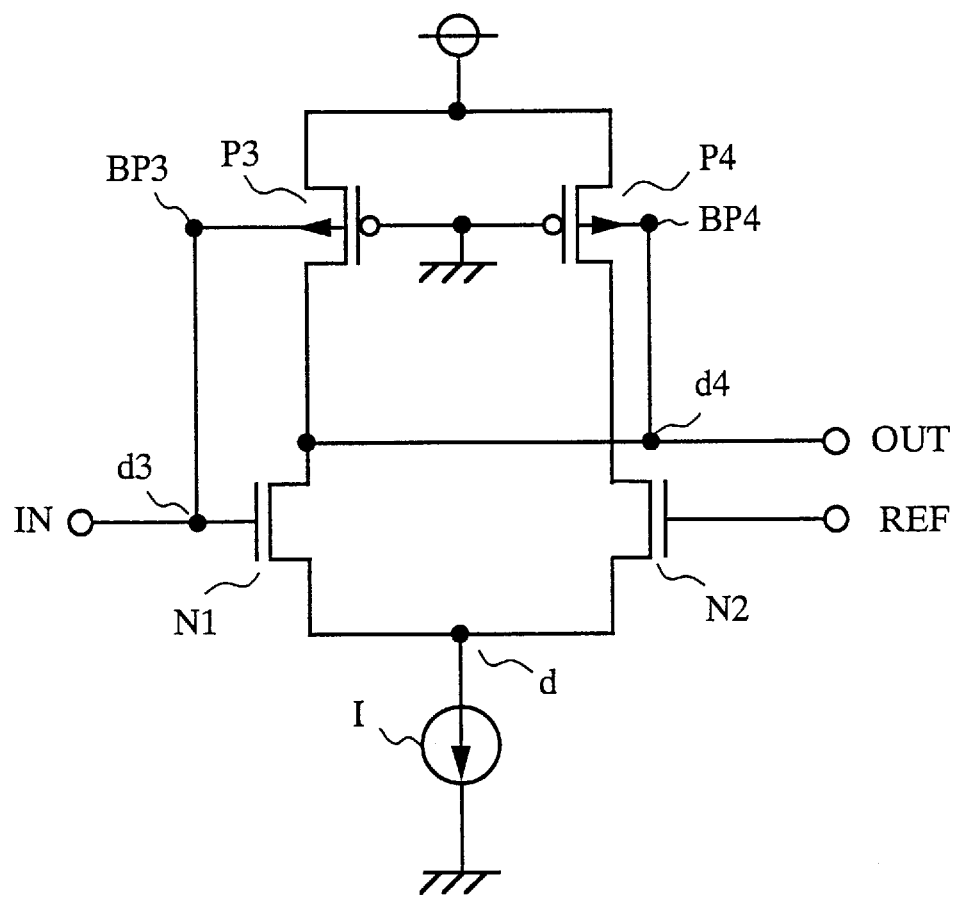
FIG. 9 is a circuit diagram showing a current mode logic circuit as the third embodiment according to the present invention.

FIG. 9 is a circuit diagram showing a current mode logic circuit as the third embodiment according to the present invention. In FIG. 9, the reference characters P3 and P4 denote PMOS transistors and BP3 and BP4 denote body terminals of the PMOS transistors P3 and P4, respectively. The reference characters d3 and d4 designate nodes. Other components in the current mode logic circuit of the third embodiment are the same as those in the current mode logic circuit of the second embodiment shown in FIGS. 7 and 8, therefore, the explanation of them is omitted here.

The current mode logic circuit of the third embodiment has the configuration in which the body terminals BP3 and BP4 of the PMOS transistors P3 and P4 are connected to the nodes d3 and d4, respectively, and the gates of the PMOS transistors P3 and P4 are connected to the ground source GND.

In the current mode logic circuit of the third embodiment, because the body terminals BP3 and BP4 of the PMOS transistors P3 and P4 are connected to the nodes d3 and d4, respectively, the On resistance of the PMOS transistors P3 and P4 are controlled by adjusting the body voltage of the PMOS transistors P3 and P4 so that the current mode logic circuit can perform at a high speed.

Next, a description will be given of the operation of the current mode logic circuits of the third embodiment shown in FIG. 9.

The body terminal BP3 of the PMOS transistor P3 is connected to the input terminal IN through the node d3. The body terminal BP4 of the PMOS transistor P4 is connected to the output terminal OUT through the node d4.

The operation of the current mode logic circuit of the third embodiment, the On resistance of the PMOS transistor P3 as a load transistor is changeable and its operation can be performed at a high speed, like the operation of the current mode logic circuit of the second embodiment shown in FIG. 7.

When comparing with the current mode logic circuit of the second embodiment, the current mode logic circuit of the third embodiment can operate at a higher speed, because the change of the body terminal BP3 of the PMOS transistor P3 is changed corresponding to the change of the voltage to be supplied to the input terminal IN.

Fourth Embodiment

Figure 10:
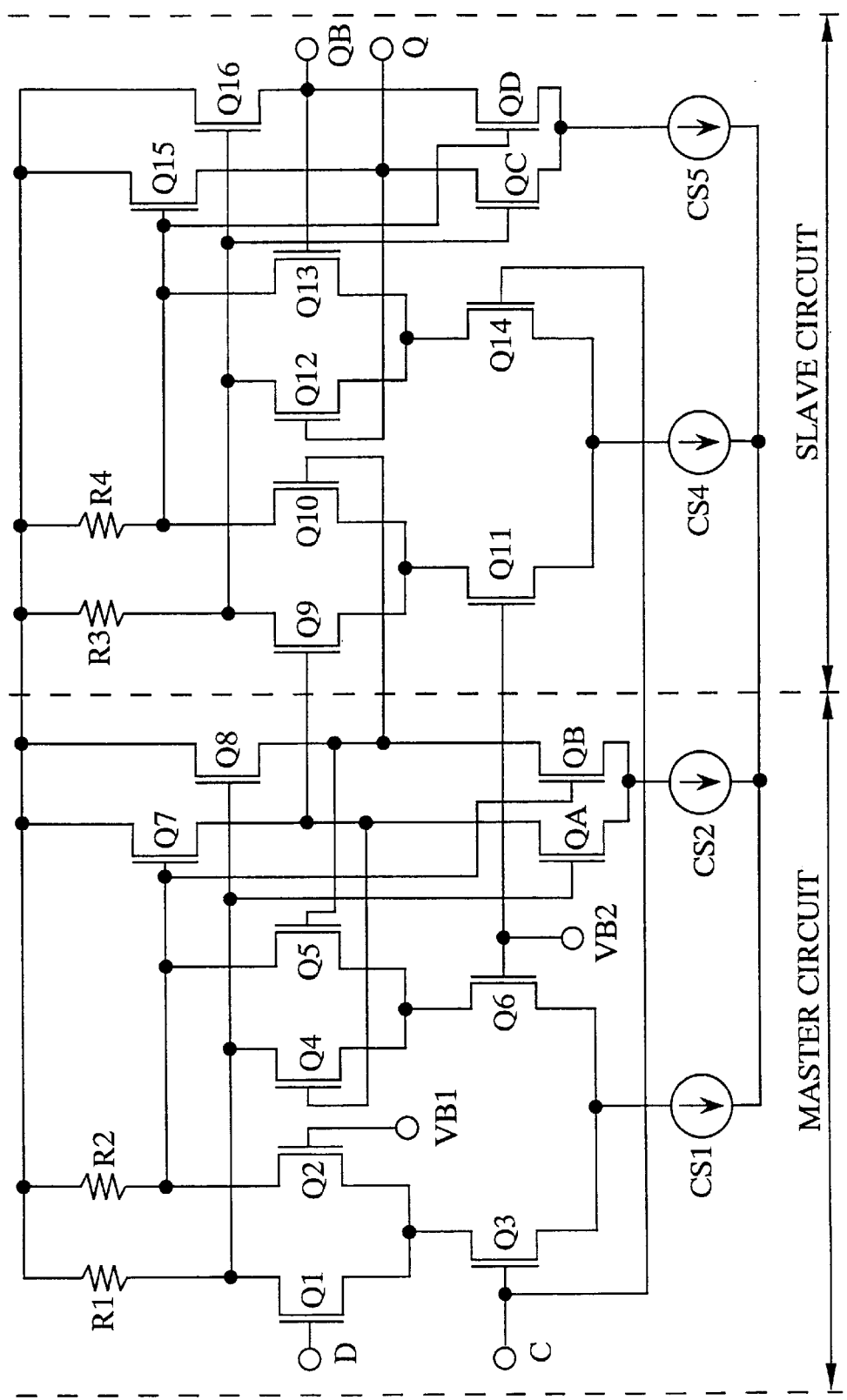
FIG. 10 is a circuit diagram showing a flip flop circuit having source follower circuits as the fourth embodiment according to the present invention.

FIG. 10 is a circuit diagram showing a flip flop circuit having a source follower circuit as the fourth embodiment according to the present invention. In FIG. 10, the reference characters Q1 to Q16, QA, QB, QC, and QD designate N conductivity type Metal Oxide Semiconductor (hereinafter referred to as NMOS) transistors. The reference characters R1 to R4 denote resistors, CS1, CS2, CS3, CS4, and CS5 indicate constant current sources, and QB, Q, and D designate terminals connected to the MOS transistors Q13, Q12, and Q1, respectively. The reference character C designates a clock input terminal to which a clock signal is supplied. The reference characters VB1 and VB2 connected to the NMOS transistors Q2 and Q6 designate reference voltage terminals. In particularly, in claims, the NMOS transistor Q7 is referred to as the fifth NMOS transistor, the NMOS transistor Q8 is referred to as the sixth NMOS transistor, the NMOS transistor QA is referred to as the seventh NMOS transistor, and the NMOS transistor QB is referred to as the eighth NMOS transistor.

The flip flop circuit having the source follower circuit as the fourth embodiment comprises a master circuit including the MOS transistors Q1 to Q8, QA, and QB and a slave circuit including the MOS transistors Q9 to Q16, QC, and QD. The source follower circuit comprises the NMOS transistors Q7, Q8, QA, QB, and the current power source CS2.

The flip flop circuit having the source follower circuit as the fourth embodiment is capable of operating at a high speed by rapidly decreasing the output of the NMOS transistor Q8 by using the source follower circuit comprising the NMOS transistors Q7, Q8, QA, QB, and the current power source CS2 in the master circuit.

Next, a description will be given of the operation of the flip flop circuit as the fourth embodiment shown in FIG. 10.

In the following explanation, the threshold voltage of the logical amplitude of the signal to be inputted to the data input terminal D is supplied to the reference voltage terminal VB1. In addition to this, the threshold voltage of the logical amplitude of the signal to be inputted to the data input terminal C is supplied to the reference voltage terminal VB2. A pair of the NMOS transistors Q1 and Q2, and a pair of the NMOS transistors Q9 and Q10 form data write circuits in the master circuit and the slave circuit, respectively. A pair of the NMOS transistors Q4 and Q5, and a pair of the NMOS transistors Q12 and Q13 form data store circuits in the master circuit and the slave circuit, respectively.

When the level of the clock signal supplied to the clock signal input terminal C is a high level, the NMOS transistors Q3 and Q14 become ON so that the data write circuit in the master circuit and the data store circuit in the slave circuit are ON. The NMOS transistors Q6 and Q11 are OFF, so that the data store circuit in the master circuit and the data write circuit in the slave circuit are in the OFF state. At this time, when the data signal ID1 to be inputted to the NMOS transistor Q1 is the high level, the NMOS transistor Q1 becomes ON and the NMOS transistor Q2 becomes OFF, and the current whose value is set by the constant current source CS1 flows in the resistor R1 through the NMOS transistors Q1 and Q3. Accordingly, NMOS transistor Q8 outputs the signal of a low level.

On the other hand, because the NMOS transistor Q2 is OFF, no current flows through the resistor R2 and the NMOS transistor Q7 outputs the signal of a high level. Thus, the data write operation is performed in the master circuit. In the slave circuit, because the data store circuit is in the ON state, the data signal ID0 that has been stored in the preceding operation is still stored and this data item ID0 is output to the data signal output terminals QB and Q through the NMOS transistors Q15 and Q16. Like the NMOS transistors Q7 and Q8, the NMOS transistors Q15 and Q16 output signals that are complementary signals to each other in level. When the level of the clock signal to be inputted to the clock signal input terminal C is changed from the high level to the low level, the NMOS transistors Q6 and Q11 become ON, so that the data store circuit in the master circuit and the data write circuit in the slave circuit become ON. The NMOS transistors Q3 and Q14 become OFF, so that the data write circuit in the master circuit and the data store circuit in the slave circuit are in the OFF state. Because the gate terminals of the NMOS transistors Q4 and Q5 are connected to the source terminals of the NMOS transistors Q7 and Q8, respectively, the NMOS transistor Q4 becomes ON and the NMOS transistor Q5 becomes OFF by the data signal ID1 that has been inputted while the level of the clock signal is the high level. Thereby, the data signal ID1 is kept in the data store circuit. Accordingly, the NMOS transistors Q7 and Q8 in the master circuit are outputting the signal to the slave circuit, that is the same value output when the level of the clock signal is the high level.

The data write circuit in the slave circuit is ON, the NMOS transistor Q7 outputs the signal of the high level, and the NMOS transistor Q8 outputs the signal of the low level. Thereby, the NMOS transistor Q9 becomes ON and the NMOS transistor Q10 becomes OFF. Accordingly, the current, that has been set by the constant current source CS4, flows in the resistor R3 through the NMOS transistors Q9 and Q11. Thereby, the NMOS transistor Q16 outputs the signal of the low level. Because the NMOS transistor Q10 is OFF, no current flows in the resistor R4, and the NMOS transistor Q15 outputs the signal of the high level. Thus, the slave circuit updates data.

The same operation described above is performed when the level of the input data to be supplied to the input terminal IN is the low level. In this case, the NMOS transistor Q16 outputs the signal of the high level, and the NMOS transistor Q15 outputs the signal of the low level. That is, the master circuit inputs and stores data while the level of the clock signal is the high level, and the slave circuit updates data while the level of the clock signal is the low level.

In the source follower circuit comprising the NMOS transistors Q7, Q8, QA, and QB, and the constant current source in the flip flop circuit of the fourth embodiment shown in FIG. 10, when the signal of the high level is inputted to the NMOS transistor Q7 and the signal of the low level is inputted to the NMOS transistor Q8, the NMOS transistor QB becomes ON, so that all of the current from the constant current source CS2 flows in the NMOS transistor QB, so that the output of the NMOS transistor Q8 can be rapidly increased. In addition, the NMOS transistor QA becomes OFF and all of the current flowing through the NMOS transistor Q7 can be used for rising the output of the NMOS transistor Q7.

As described above in detail, according to the fourth embodiment, it is possible to rapidly rise the output of the NMOS transistor Q8 by the source follower circuit comprising the NMOS transistors Q7, Q8, QA, and QB in the master circuit. In this case, the NMOS transistor QA becomes OFF and all of the current flowing through the NMOS transistor Q7 can be used for rising the output of the NMOS transistor Q7. Thereby, it is possible to perform the flip flop circuit of the fourth embodiment at a high speed.

Fifth Embodiment

Figure 11:
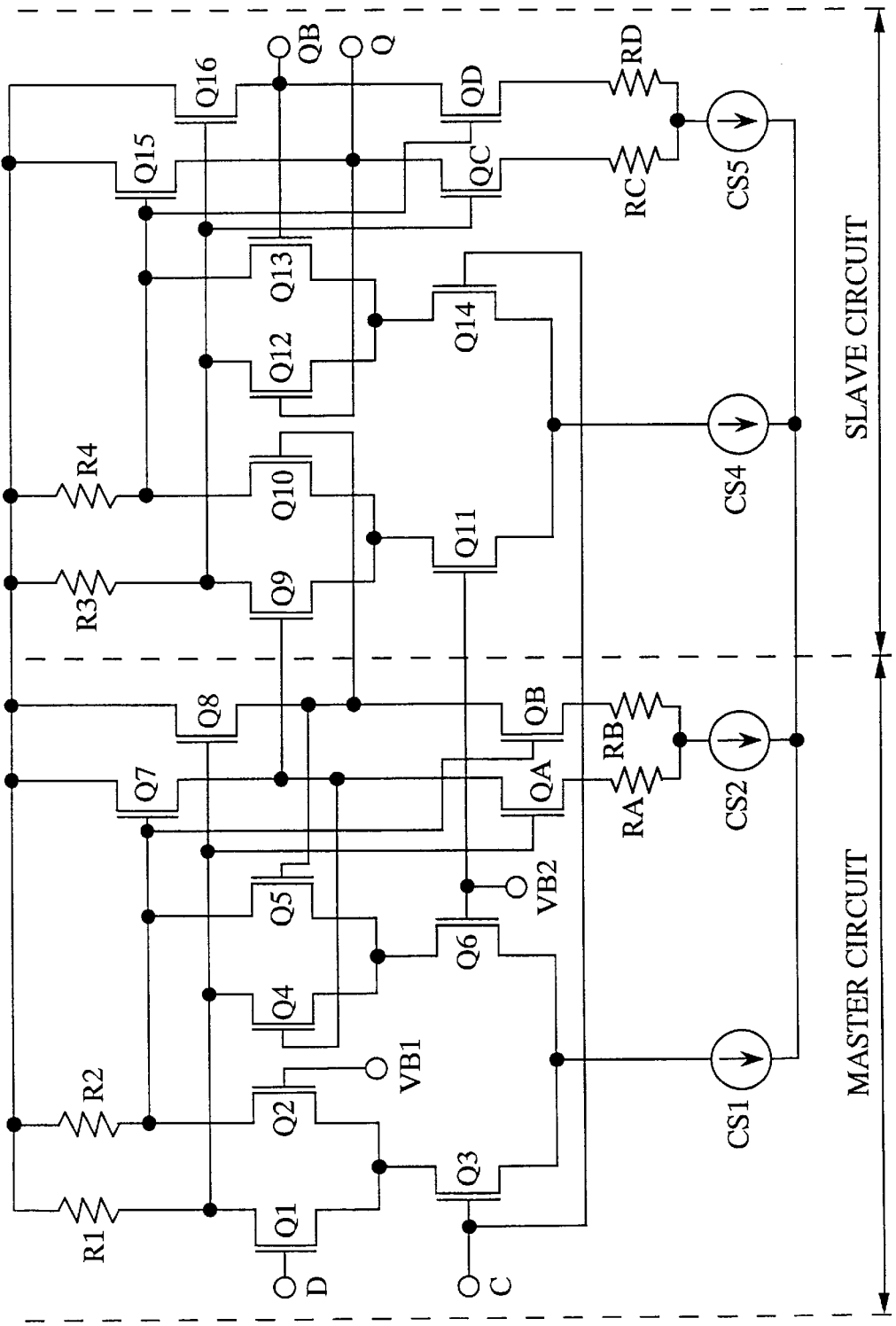
FIG. 11 is a circuit diagram showing a flip flop circuit having source follower circuits as the fifth embodiment according to the present invention.

FIG. 11 is a circuit diagram showing a flip flop circuit having a source follower circuit as the fifth embodiment according to the present invention. In FIG. 11, the reference characters RA, RB, RC, and RD designate resistors that are connected to the gates of the NMOS transistors QA, QB, QC, and QD, respectively. The other terminals of the resistors RA and RB are connected to the constant current source CS2. Similarly to this, the other terminals of the resistors RC and RD are connected to the constant current source CS5. Other components of the flip flop circuit of the fifth embodiment are the same as those of the flip flop circuit of the fourth embodiment shown in FIG. 10, therefore, the explanation of them is omitted here.

The flip flop circuit having the source follower circuit as the fifth embodiment shown in FIG. 11 comprises a master circuit and a slave circuit. The master circuit comprises the MOS transistors Q1 to Q8, QA, and QB, the constant current sources CS1 and CS2, and the resistors R1, R2, RA, and RB. The slave circuit comprises the MOS transistors Q9 to Q16, QC, and QD, the constant current sources CS4 and CS5, and the resistors R3, R4, RC, and Rd.

In the flip flop circuit of the fifth embodiment, the resistors RA and RB are incorporated between the sources of the NMOS transistors QA and QB and the constant current source CS2. In the slave circuit, the resistors RC and RD are incorporated between the sources of the NMOS transistors QC and QD and the constant current source CS5. This configuration of the fifth embodiment causes that one of the NMOS transistors QA and QB in the master circuit, or one of the NMOS transistors QC and QD in the slave circuit do not become OFF. That is, the flip flop circuit of the fifth embodiment can operate at a high speed. The operation of the flip flop circuit is performed as follows:

In the master circuit, the NMOS transistor QB becomes ON immediately, and most of the current from the constant current source CS2 flows through the NMOS transistor QB, so that the output of the NMOS transistor Q8 is rapidly fallen. At this time, the NMOS transistor QA becomes ON gradually and most of the current flowing through the NMOS transistor Q7 can be used to rise the output of the NMOS transistor Q7, so that the flip flop can operate at a high speed.

Next, a description will be given of the operation of the flip flop circuit as the fifth embodiment shown in FIG. 11.

When the signal of a high voltage level is inputted to the gate terminal of the NMOS transistor Q7 and when the signal of a low voltage level is inputted to the gate terminal of the NMOS transistor Q8, the NMOS transistor QB becomes ON immediately and most of the current from the constant current source CS2 flows through the NMOS transistor QB, so that the output of the NMOS transistor Q8 is increased at a high speed. At this time, the NMOS transistor QA becomes ON gradually and most of the current flowing through the NMOS transistor Q7 can be used to rise the output of the NMOS transistor Q7. Thereby, it is realized to perform the flip flop circuit at a high speed.

The operation of the flip flop circuit of the fifth embodiment is basically same as that of the flip flop circuit of the fourth embodiment. Specifically, in order to enter one of the NMOS transistors QA and QB in the master circuit into the OFF state completely and in order to enter one of the NMOS transistors QC and QD in the slave circuit into the OFF state completely, the flip flop circuit has the configuration in which the resistors RA and RB are incorporated between the sources of the NMOS transistors QA and QB and the constant current source CS2 in the master circuit, and the resistors RC and RD are incorporated between the sources of the NMOS transistors QC and Qd and the constant current source CS5 in the slave circuit.

For example, in the flip flop circuit of the fourth embodiment, there is a possibility to happen a case in which the output level of the NMOS transistor Q7 is increased when the NMOS transistor QA becomes OFF completely and the flip flop circuit is performed by a leak current flowing through the NMOS transistor Q7 in a low frequency. On the other hand, in the flip flop circuit of the fifth embodiment, there is no possibility to happen the above case.

In both of the fourth and fifth embodiments, the explanation of the flip flop circuit having the source follower circuit, but the present invention is not limited by the fourth and fifth embodiments, the present invention can be applied to general current mode logic circuits. In addition to this, it is acceptable that the body terminal of the NMOS transistor can be connected to one of the source terminal and the body terminal.

As described above in detail, according to the fifth embodiment, the master circuit in the flip flop circuit including the source follower circuit, the NMOS transistor QB becomes ON immediately and most of the current from the constant current source CS2 flows through the NMOS transistor QB, and the output of the NMOS transistor can rise at a high speed. At this time, the NMOS transistor QA becomes ON gradually and most of the current flowing through the NMOS transistor Q7 can be used to rise the output of the NMOS transistor Q7, so that the flip flop circuit of the fifth embodiment can perform at a high speed.

In summary, as described above in detail, according to the present invention, a current mode logic circuit has the configuration in which a current mode logic circuit comprises a first NMOS transistor and a second NMOS transistor, a data input terminal connected to a gate of the first NMOS transistor to which data is inputted, a reference voltage input terminal connected to a gate of the second NMOS transistor to which a reference voltage is supplied, an output terminal connected to a drain of the first NMOS transistor, and a constant current source connected to both of sources of the first NMOS transistor and the second NMOS transistor. In the current mode logic circuit, a body terminal of the first NMOS transistor is connected to the data input terminal and a body terminal of the second NMOS transistor is connected to the reference voltage input terminal so that a level of a body voltage of each of the first NMOS transistor and the second NMOS transistor is controlled. Thereby, the present invention has the effect that it is possible to reduce the threshold voltage of each of the first and second NMOS transistors and to perform them in a low voltage.

In addition, according to the present invention, the current mode logic circuit has the configuration in which a drain of each of the first NMOS transistor and the second NMOS transistor is connected to a power source voltage. Thereby, the present invention has the effect that the current mode logic circuit can operate in a low voltage.

Furthermore, according to the present invention, the current mode logic circuit has the configuration in which a first NMOS transistor and a second NMOS transistor, a data input terminal connected to a gate of the first NMOS transistor to which data is inputted, a reference voltage input terminal connected to a gate of the second NMOS transistor to which a reference voltage is supplied, an output terminal connected to a drain of the first NMOS transistor or the second NMOS transistor, a first PMOS transistor as a load element whose source is connected to a power source voltage and whose gate is connected to a ground source and whose drain is connected to a drain of the first NMOS transistor, and a second PMOS transistor as a load element whose source is connected to the power source voltage and whose gate is connected to the ground source and whose drain is connected to a drain of the second NMOS transistor. In the current mode logic circuit, a body terminal of the first PMOS transistor is connected to the drain of the second NMOS transistor and a body terminal of the second PMOS transistor is connected to the drain of the first NMOS transistor, wherein an ON resistance of each of the first PMOS transistor and the second PMOS transistor is controlled by adjusting a level of the body voltage of the first PMOS transistor and the second PMOS transistor. Thereby, the present invention has the effect that the current mode logic circuit can operate at a high speed.

Moreover, according to the present invention, the current mode logic circuit has the configuration in which the gate of each of the first PMOS transistor and the second PMOS transistor is connected to the ground source, the body terminal of the first PMOS transistor is connected to the gate of the first NMOS transistor, the body terminal of the second PMOS transistor is connected to the drain of the first NMOS transistor so that the ON resistance of each of the first PMOS transistor and the second PMOS transistor is controlled. Thereby, the present invention has the effect that the current mode logic circuit can operate at a high speed.

In addition, according to the present invention, the source follower circuit has the configuration in which a current switch comprises a fifth NMOS transistor and a sixth NMOS transistor, a seventh NMOS transistor connected to a source of the fifth NMOS transistor, an eighth NMOS transistor connected to a source of the sixth NMOS transistor, and a current power source connected to both of the sources of the seventh NMOS transistor and the eighth NMOS transistor.

In the source follower circuit, both gates of the fifth NMOS transistor and the eighth NMOS transistor form a first input terminal to which a first input is provided, both gates of the sixth NMOS transistor and the seventh NMOS transistor form a second input terminal to which a second input whose level is obtained by inverting the level of the first input is provided, the source of the fifth NMOS transistor is connected to a drain of the seventh NMOS transistor, and the source of the sixth NMOS transistor is connected to a drain of the eighth NMOS transistor. Thereby, the present invention has the effect that the source follower circuit can operate at a high speed.

Furthermore, according to the present invention, the source follower circuit has the configuration in which resistors are connected between the source of the seventh NMOS transistor and the current power source, and between the source of the eighth NMOS transistor and the current power source, respectively. Thereby, the present invention has the effect that the current mode logic circuit can operate at a high speed.

Moreover, according to the present invention, the flip flop circuit has the configuration in which the source follower circuit as described above, a data write circuit comprising at least two NMOS transistors, and a data store circuit for storing data comprising at least two NMOS transistor. In the flip flop circuit, a pair of a drain of one of the two NMOS transistors in the data write circuit and a drain of one of the two NMOS transistors in the data store circuit is connected to the gate of the fifth NMOS transistor, and a pair of a drain of the other NMOS transistor in the data write circuit and a drain of the other NMOS transistors in the data store circuit is connected to the gate of the sixth NMOS transistor in the source follower circuit, respectively, and gates of the two NMOS transistors in the data store circuit are connected to the sources of the fifth NMOS transistor and the sixth NMOS transistor, respectively. Thereby, the present invention has the effect that the flip flop circuit can operate at a high speed.

Furthermore, according to the present invention, the flip flop circuit has the configuration in which the source follower circuit as described above, a data write circuit comprising at least two NMOS transistors, and a data store circuit for storing data comprising at least two NMOS transistors. In the flip flop circuit, a pair of a drain of one of the two NMOS transistors in the data write circuit and a drain of one of the two NMOS transistors in the data store circuit is connected to the gate of the fifth NMOS transistor, and a pair of a drain of the other NMOS transistor in the data write circuit and a drain of the other NMOS transistors in the data store circuit is connected to the gate of the sixth NMOS transistor in the source follower circuit, respectively, and gates of the two NMOS transistors in the data store circuit are connected to the sources of the fifth NMOS transistor and the sixth NMOS transistor, respectively. Thereby, the present invention has the effect that the flip flop circuit can operate at a high speed.

While the above provides a full and completes disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A source follower circuit forming a current switch comprising:
    a first NMOS transistor and a second NMOS transistor, a third NMOS transistor connected to a source of the first NMOS transistor,
    an fourth NMOS transistor connected to a source of the second NMOS transistor; and
    a current power source connected to both of the sources of the third NMOS transistor and the fourth NMOS transistor,
    wherein both gates of the first NMOS transistor and the fourth NMOS transistor form a first input terminal to which a first input is provided, both gates of the second NMOS transistor and the third NMOS transistor form a second input terminal to which a second input whose level is obtained by inverting the level of the first input is provided, the source of the first NMOS transistor is connected to a drain of the third NMOS transistor and to a first output, and the source of the second NMOS transistor is connected to a drain of the fourth NMOS transistor and to a second output.

2. A source follower circuit as claimed in claim 1, wherein resistors are connected between the source of the third NMOS transistor and the current power source, and between the source of the fourth NMOS transistor and the current power source, respectively.

3. A flip flop circuit comprising:
    a source follower circuit including
        a first NMOS transistor and a second NMOS transistor;
        a third NMOS transistor connected to a source of the first NMOS transistor
        an fourth NMOS transistor connected to a source of the second NMOS transistor; and
        a current power source connected to both of the sources of the third NMOS transistor and the fourth NMOS transistor
        wherein both gates of the first NMOS transistor and the fourth NMOS transistor form a first input terminal to which a first input is provided, both gates of the second NMOS transistor and the third NMOS transistor form a second input terminal to which a second input whose level is obtained by inverting the level of the first input is provided, the source of the first NMOS transistor is connected to a drain of the third NMOS transistor and to a first output, and the source of the second NMOS transistor is connected to a drain of the fourth NMOS transistor and to a second output;
    a data write circuit comprising at least two NMOS transistors for receiving a pair of input signals; and
    a data store circuit for storing data comprising at least two NMOS transistor,
    wherein a pair of a drain of one of the two NMOS transistors in the data write circuit and a drain of one of the two NMOS transistors in the data store circuit is connected to the gate of the first NMOS transistor, and a pair of a drain of the other NMOS transistor in the data write circuit and a drain of the other NMOS transistors in the data store circuit is connected to the gate of the second NMOS transistor in the source follower circuit, respectively, and gates of the two NMOS transistors in the data store circuit are connected to the sources of the first NMOS transistor and the second NMOS transistor, respectively.

4. A flip flop circuit comprising:
    a source follower circuit including
        a first NMOS transistor and a second NMOS transistor;
        a third NMOS transistor connected to a source of the first NMOS transistor,
        an fourth NMOS transistor connected to a source of the second NMOS transistor; and a current power source connected to both of the sources of the third NMOS transistor and the fourth NMOS transistor, wherein both gates of the first NMOS transistor and the fourth NMOS transistor form a first input terminal to which a first input is provided, both gates of the second NMOS transistor and the third NMOS transistor form a second input terminal to which a second input whose level is obtained by inverting the level of the first input is provided, the source of the first NMOS transistor is connected to a drain of the third NMOS transistor and to a first output, and the source of the second NMOS transistor is connected to a drain of the fourth NMOS transistor and to a second output, and wherein resistors are connected between the source of the third NMOS transistor and the current power source, and between the source of the fourth NMOS transistor and the current power source, respectively;

a data write circuit comprising at least two NMOS transistors; and a data store circuit for storing data comprising at least two NMOS transistors, wherein a pair of a drain of one of the two NMOS transistors in the data write circuit and a drain of one of the two NMOS transistors in the data store circuit is connected to the gate of the first NMOS transistor, and a pair of a drain of the other NMOS transistor in the data write circuit and a drain of the other NMOS transistors in the data store circuit is connected to the gate of the second NMOS transistor in the source follower circuit, respectively, and gates of the two NMOS transistors in the data store circuit are connected to the sources of the first NMOS transistor and the second NMOS transistor, respectively.

* * * * *